United States Patent [19]
Walley et al.

[11] Patent Number: 5,302,863
[45] Date of Patent: Apr. 12, 1994

[54] CMOS PEAK AMPLITUDE DETECTOR

[75] Inventors: Thomas M. Walley, Loveland; Larry S. Metz, Ft. Collins; Charles E. Moore, Loveland, all of Colo.

[73] Assignee: Hewlett-Packard Company, Palo Alto, Calif.

[21] Appl. No.: 11,028

[22] Filed: Jan. 29, 1993

[51] Int. Cl.[5] .................. G11C 27/02; H03K 5/153
[52] U.S. Cl. ..................... 307/351; 307/358
[58] Field of Search ............. 307/350, 351, 352, 358, 307/359, 491, 494, 520, 265, 267, 268, 353, 243; 328/165, 167

[56]          References Cited
            U.S. PATENT DOCUMENTS

| | | | |
|---|---|---|---|
| 4,250,406 | 2/1981 | Alaspa | 307/279 |
| 4,263,548 | 4/1981 | Carlson et al. | 307/351 |
| 4,305,042 | 12/1981 | Tanaka et al. | 328/165 |
| 4,473,759 | 9/1984 | Mahabadi | 307/350 |
| 4,634,895 | 1/1987 | Luong | 307/350 |
| 4,709,204 | 11/1987 | Hayakawa | 307/351 |
| 5,015,878 | 5/1991 | Lasagna et al. | 307/358 |

Primary Examiner—Timothy P. Callahan
Assistant Examiner—My Trang Nu Ton
Attorney, Agent, or Firm—Patrick J. Murphy

[57] ABSTRACT

A fully-integrated CMOS peak detector stores the peak amplitude of an input signal using an on-chip storage capacitor. The fully-integrated CMOS peak detector includes a delay buffer, a transfer gate and a comparator. A discharge controller is used to step-down the peak amplitude stored on the on-chip storage capacitor some predetermined amount. The discharge controller includes a switched capacitor circuit which is placed in series with the storage capacitor such that the two capacitors act as a capacitive voltage divider to produce a predictable fraction of the acquired peak amplitude. Multiple peaks can be determined and/or stored by using multiple fully-integrated CMOS peak detectors in conjunction with a single comparator. A multiplexer is used in this configuration to control the multiple peak detectors.

17 Claims, 9 Drawing Sheets

CMOS PEAK AMPLITUDE DETECTOR

BACKGROUND OF THE INVENTION

1. Field of the Invention

The present invention relates generally to the peak amplitude detection of high frequency signals and more particularly to a CMOS peak detector that does not require an off-chip peak storage capacitor.

2. Description of the Prior Art

Active peak detectors are used in applications which require the peak value of an input waveform to be determined or stored. Simple peak detectors may be constructed of a diode and a capacitor in which the highest value of the input signal charges the capacitor. There are several disadvantages to this simple set-up, including variable input impedance and temperature-induced diode drops. Another form of a peak detector employs operational amplifiers and feedback loops. The feedback, which is taken from the stored voltage at the capacitor, compensates for the diode drop. However, these circuits still suffer from variable input impedance problems.

Peak detectors known in the art are constructed using bipolar technology. One problem with bipolar technology is that it has a high rate of power dissipation. A bipolar peak detector also requires a high voltage supply (i.e., greater than 5 volts) to provide sufficient voltage swing through the diode, and hence, ensure linearity. Another problem with bipolar detectors is reverse leakage inherent in the diode which thereby sets the lower bound discharge rate of the capacitor. Furthermore, these peak detectors employ off-chip capacitors to store the peak amplitude. This additional circuitry adds significantly to cost and results in slightly less reliable performance.

Frequently, it is desired to step-down the stored peak amplitude in anticipation of receiving the next succeeding pulse. With respect to bipolar technology, discharging the storage capacitor involves either a large resistor or a current source tied to a DC voltage source. In the case of using the resistor, the amount of step-down must be fixed prior to circuit assembly (i.e., the desired step-down amount determines the value of the resistor). In both instances, the step-down results in a steady discharge of the storage capacitor from the instant the capacitor acquires the peak. Thus, succeeding circuit stages will not receive the true peak amplitude since a small amount will have already been discharged.

It would be advantageous if a peak detector could be implemented using CMOS technology and an on-chip storage capacitor, thereby decreasing overall power requirements and providing the ability to control the charge step-down on the storage capacitor. Another benefit could be realized if a single comparator could be used for multiple peak detectors.

SUMMARY OF THE INVENTION

The present invention overcomes the disadvantages and limitations of the prior art by providing a peak amplitude detector fully comprised of Complementary Metal-Oxide Semiconductor Field-Effect Transistor (CMOS) technology with the peak storage capacitor integrated into the detector chip, thus removing any off-chip elements. The peak amplitude detector of the present invention is a fully integrated CMOS chip comprising a comparator, a delay buffer, transfer gates, an inverter and a storage capacitor.

In addition to the integration of all elements of the peak detector onto one chip, the present invention has low-power requirements due to the utilization of the CMOS technology. Thus, a 5 volt power supply is all that is needed for circuit operation. Further advantages are gained by providing a unity-gain active filter as a delay buffer, thereby increasing the accuracy of the peak detector in relation to very fast input signals. The active filter can be either low pass or high pass.

A discharge controller is provided to step-down the voltage on the on-chip storage capacitor some predetermined amount. The step-down does not occur until after some sufficient time so that subsequent circuitry may receive the true peak acquired by the storage capacitor. This controller utilizes a switched capacitor, in conjunction with the storage capacitor, to remove some charge from the storage capacitor in anticipation of receiving additional inputs. The switched capacitor and the storage capacitor act as a capacitive voltage divider to produce a predictable fraction of the acquired peak amplitude. An advantage of this controller is that the discharge rate can be programmed via software either prior to or during operation. In addition, the charge is stepped-down, as opposed to the constant discharge following peak acquisition characteristic of prior art solutions, to provide a more accurate peak amplitude to successive circuit stages.

Multiple peaks can be determined or stored using at least two CMOS peak amplitude detectors in series. One configuration of this circuit is an aggregate of single peak detector assemblies, each sub-assembly having a peak detector and a separate comparator. A problem with this configuration is the signal errors introduced by using multiple comparators. Each comparator has characteristic voltage offset, gain and node capacitances (i.e., no two comparators will have the same characteristics), which results in different delays. Hence, the difference of the outputs of the peak detection circuits detecting the same amplitude input will be some small $\Delta v$ volts instead of the desired 0 volts.

For example, a circuit with two peak detectors and two comparators which is set to acquire the same sized peak will hit the input at different points. An ideal comparator will change state when the positive input of the comparator is just slightly negative with respect to the delayed input at the negative input of the comparator at some time $t_n$. However, due to inherent comparator characteristics such as input offset, state change in a first comparator will occur at some $t_n + t_1$. State change in a second comparator may occur at some $t_n + t_2$. While these time shifts are illustrative for the present discussion, $t_2$ need not be different than $t_1$. In other words, either $t_1 = t_2$, $t_1 > t_2$ or $t_1 < t_2$ will suffice for further discussion.

If the first comparator has a time delay of $t_{d1}$ and the second comparator has a delay of $t_{d2}$, then each peak detector will acquire a voltage that is at a different point along the delayed input signal. In other words, the first comparator will acquire the peak at $[(t_n + t_1) + t_{d1}]$, while the second comparator will acquire the peak at $[(t_n + t_2) + t_{d2}]$.

This acquisition problem is obviated if at least two CMOS peak amplitude detectors are used in conjunction with a single comparator. Control signals and an analog multiplexer are used to control when the first peak detector is activated to receive the input signal and the output from the single comparator, to the exclusion of the second peak detector, and when the second peak detector is activated, to the exclusion of the first.

BRIEF DESCRIPTION OF THE DRAWINGS

FIG. 4b shows a representative input signal to the circuit of FIG. 4a.

FIG. 6b is a continuation of FIG. 6a.

DETAILED DESCRIPTION OF THE PREFERRED EMBODIMENT

For purposes of the following discussion, the term "high" corresponds to a high voltage, typically 5 volts, while the term "low" corresponds to a low voltage, typically 0 volts. However, it will be obvious to one of ordinary skill in the art that a high voltage may be any sufficient magnitude (i.e., high $\geq 0$), provided the voltage can turn on a circuit element; a low voltage may be any sufficient magnitude (i.e., low $\geq 0$) which effectively turns off a circuit element.

Figure 1:
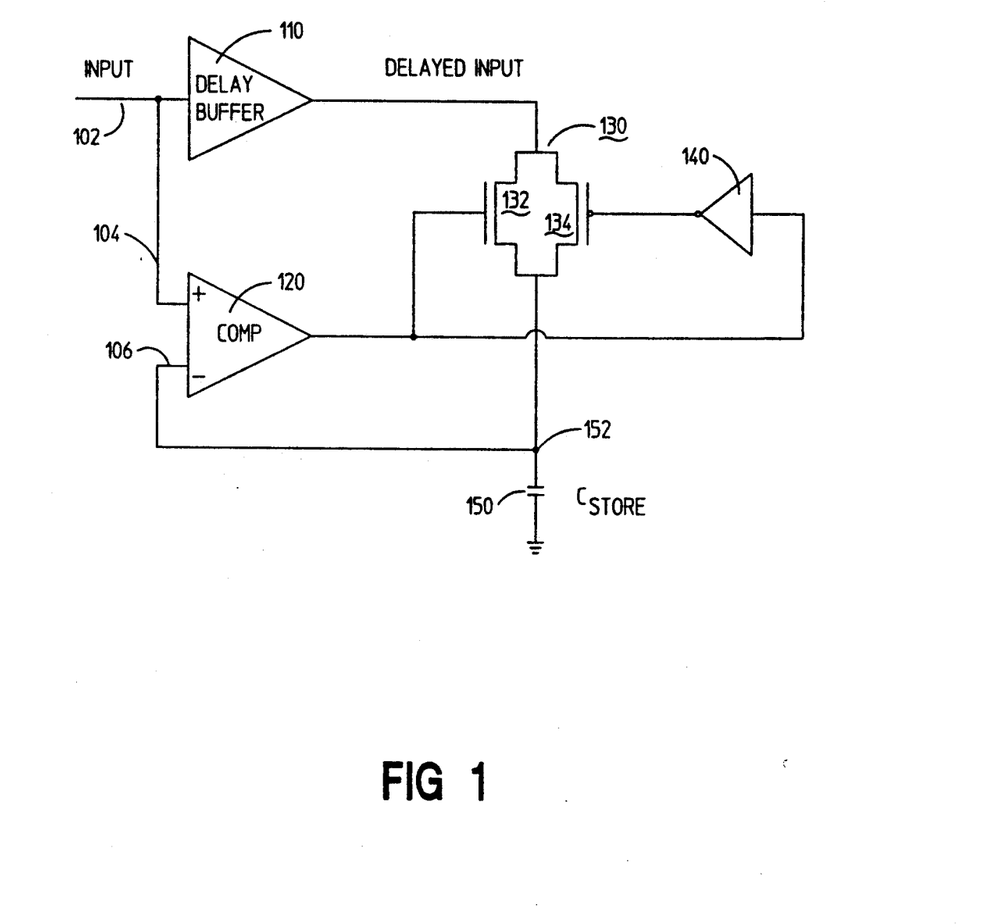
FIG. 1 shows a CMOS peak amplitude detector according to the present invention.

FIG. 1 shows a Complementary Metal-Oxide Semiconductor Field-Effect Transistor (CMOS) positive peak amplitude detector of the present invention. An input signal 102 enters a delay buffer 110 and the positive input 104 of a comparator 120. The delay buffer 110 delays the input some delta time before it enters a transfer gate 130. The delay buffer 110 is a unity-gain active filter with delay that is approximately the same as the delay of the comparator 120. The actual delay typically ranges from 5 ns to 10 ns.

The transfer gate 130 is constructed of two transistors 132, 134. The transfer gate can alternatively be a single transistor. Implementation of a single transistor transfer gate must take into account the voltage magnitude to be sent across the transfer gate. For instance, if the voltage to be passed is low or close to ground, an n-channel transistor should be used since it has less resistance towards ground. Likewise, if the voltage to be passed is high, a p-channel transistor should be used as the single transfer gate since its resistance decreases with higher voltages.

The drain terminal of transistor 132 is tied to the source terminal of transistor 134; the source terminal of transistor 132 is tied to the drain terminal of transistor 134. The gate terminal of transistor 132 is connected to the output of the comparator 120. The gate terminal of transistor 134 is connected to the output of an inverter 140 which, in turn, has its input connected to the output of the comparator 120. In this configuration, transistor 132 is an n-channel transistor and transistor 134 is a p-channel transistor. It will be obvious to one skilled in the art that transistor 132 may be p-channel, while transistor 134 may be n-channel without deviating from the scope of the invention.

An on-chip storage capacitor 150, which stores the peak amplitude of the input signal 102, is connected to the output of the transfer gate 130 and ground. The voltage from the storage capacitor 150 is fed back into the negative input 106 of the comparator 120 for comparison to the input signal 102. While the storage capacitor 150 may be any reasonable value, the preferred embodiment is approximately 1 picofarad.

Generally, the input signal 102 is continually compared to the voltage on the storage capacitor 150. When the input signal 102 rises above the stored voltage, the comparator 120 changes state and turns on the transfer gate 130 so that the new amplitude is stored on the storage capacitor 150. When the input signal 102 goes below this newly stored amplitude, the comparator 120 turns off the transfer gate 130. This operation assumes that the delay through the transfer gate 130 is much smaller than the delay buffer 110 and that there is no difference between the turn-off time of the comparator 120 and the delay time generated by the delay buffer 110. Delay through the transfer gate 130 is on the order of 0.5 ns, which is significantly lower than the delay generated by the delay buffer 110.

While the discussion above refers to positive peak detection, it will be obvious to one with ordinary skill in the art that the configuration of a negative peak amplitude detector is constructed in a similar manner.

Figure 2:
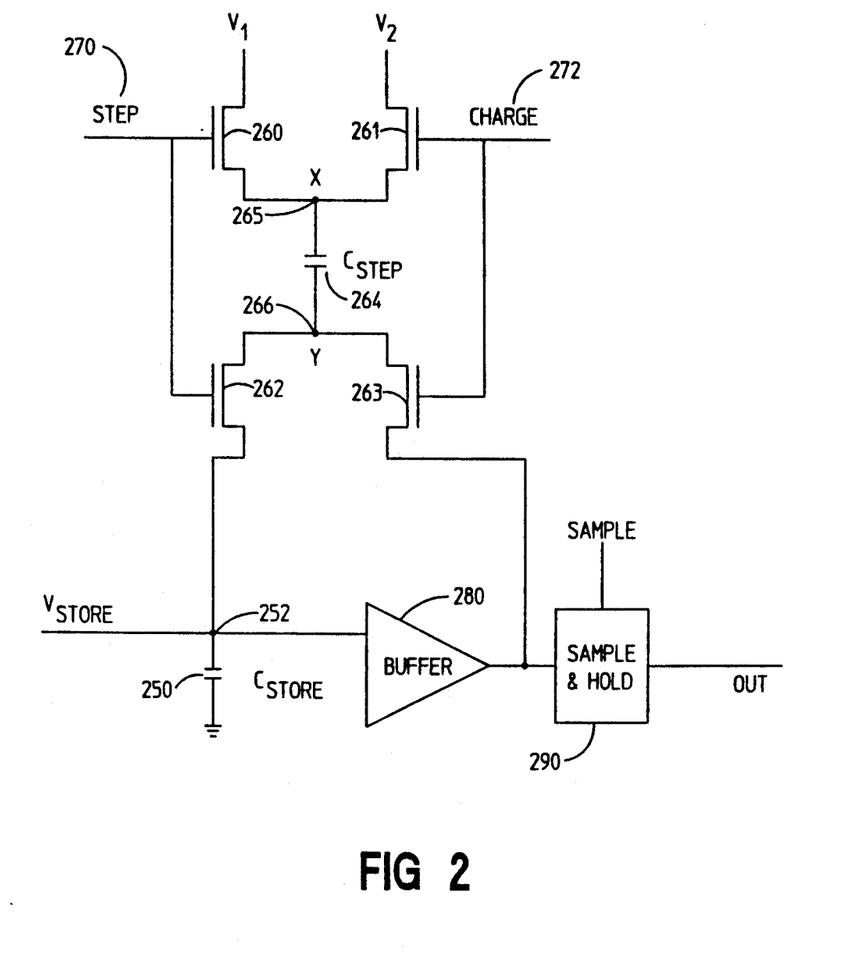
FIG. 2 shows a discharge controller for the CMOS peak amplitude detector.

FIG. 2 shows a discharge controller for the CMOS peak amplitude detector. Typically, input signals will not consist of a succession of higher peaks; that is, not all peak amplitudes will be higher than the associated preceding peak amplitudes. After a peak is acquired by the peak detector and used by succeeding circuitry, the voltage on the on-chip storage capacitor must be stepped-down some predetermined amount in anticipation of the next pulse of the input signal. The discharge controller accomplishes this task and provides several additional benefits as will be discussed more fully below.

The storage capacitor 250 and node 252 are the same storage capacitor and node as seen in FIG. 1 (i.e., items 150 and 152 respectively).

A step capacitor 264 is used to remove some of the charge from the storage capacitor 250 in preparation for receiving the next pulse. The step capacitor 264 is essentially a switched capacitor which is placed in series to the storage capacitor 250. The step capacitor 264 is typically lower in value than the storage capacitor 250 and in a preferred embodiment, the step capacitor is approximately one-half picofarad.

The step capacitor 264 is connected to the source terminals of transistors 260, 261 and the drain terminals of transistors 262, 263. The drain terminal of transistor 260 is connected to $V_1$, generally some constant voltage source; the drain terminal of transistor 261 is connect to $V_2$. In a preferred embodiment, $V_2$ is an adjustable voltage from a digital-to-analog converter (DAC) and is programmable. In order to step-down the voltage on the storage capacitor 250, $V_2$ is greater than or equal to $V_1$. It will be obvious to one with ordinary skill in the art that $V_1$ and $V_2$ are interchangeable; that is, $V_1$ could be an adjustable DAC voltage while $V_2$ could be some constant voltage source. Additionally, the adjustable voltage need not be digital but could be analog.

The voltage on the storage capacitor 250 is delayed some incidental amount by buffer 280 before being passed onto a subsequent stage, in this case a sample and hold 290. Other successive circuitry stages can be used in place of the sample and hold 290 without departing from the spirit and scope of the present invention.

Transistors 260, 262 are driven by logical STEP 270; transistors 261,263 are driven by logical CHARGE 272. While the peak amplitude is being acquired by the storage capacitor 250, CHARGE 272 is driven high. The peak is then passed onto the sample and hold 290. At the same time, the voltage across the step capacitor 264 is equal to the voltage on the storage capacitor 250 ($V_{store}$) minus $V_2$. That is, node y 266 is equal to $V_{store}$ and node x 265 is equal to $V_2$ since a high CHARGE 272 turns on transistors 261,263. When CHARGE 272 is brought low, transistors 261,263 are turned off.

Logical STEP 270 is brought high to remove a fraction of the voltage from the storage capacitor 250 in preparation for receiving the next input pulse. When this is done, transistors 260, 262 are turned on. This shorts node 265 to $V_1$ and node 266 to $V_{store}$. The step capacitor 264 and the storage capacitor 250 act as a capacitive voltage divider since they are now in series due to transistor 262 being turned on. Hence, the final voltage on the storage capacitor 250 after step-down is:

$$V_{final} = V_{initial} - \left( \frac{C_{step}}{C_{store} + C_{step}} * (V_2 - V_1) \right). \quad \text{Eq. 1}$$

where $V_{initial}$ is the initial peak amplitude acquired by the storage capacitor 250 when CHARGE 272 is high and $V_{final}$ is the voltage on the storage capacitor 250 after being stepped-down in anticipation of acquiring the next pulse. In reality, there is some additional voltage associated with equation 1 as a result of buffer offset from buffer 280 which will appear at node y 266 when CHARGE turns on transistor 263. The buffer offset ($V_{offset}$) is defined as the difference between the output of the buffer and the input of the buffer. Thus, factor $V_2 - V_1$ is really $V_2 - V_1 - V_{offset}$, where $V_{offset}$ is generally in the order of millivolts so as to not substantially affect equation 1. Ideally $V_{offset}$ is 0 volts.

In reference to equation 1, $V_2 - V_1$ controls the amount of step-down which will be taken. $V_2$, which is an adjustable voltage, is controllable by software; hence, the amount of step-down on the storage capacitor 250 can be programmed prior to or during operation of the peak amplitude detector.

Figure 3:
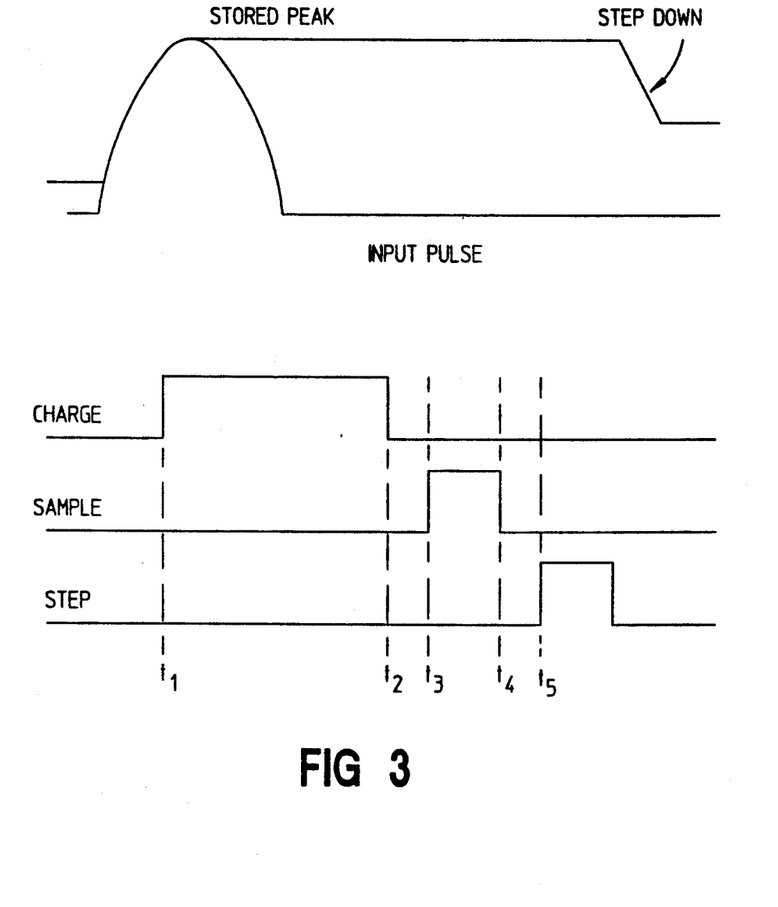
FIG. 3 shows a timing diagram for operating the CMOS peak detector with the discharge controller according to the present invention.

FIG. 3 shows the timing of the control signals and the effect of the step-down on the peak amplitude. The input signal 302 is shown as a single pulse to simplify discussion. The stored peak 352 starts at a lower magnitude than the peak of the input signal 302 for this discussion. As the input pulse 302 enters the peak detector, CHARGE 310 is brought high at time $t_1$ until the entire input pulse 302 passes through the circuit ($t_2$). The on-chip storage capacitor (not shown) acquires the peak amplitude of the input pulse 302 as represented by the stored peak 352. This peak 352 is maintained until the sample and hold (not shown) can acquire it, as illustrated by SAMPLE 320 being brought high at $t_3$ and being held high until $t_4$. The stored peak 352 is then stepped-down some predetermined amount when STEP 330 is brought high at $t_5$. Note that STEP 330 is not brought high until the sample and hold has received the stored peak 352 (i.e., $t_5 > t_4$). This ensures that successive circuitry, in this case a sample and hold, receives the true peak amplitude of the input signal 302. Once the stored peak 352 is stepped-down, the peak detector is now ready to receive a new peak which can be lower than the previous peak.

Figure 4A:
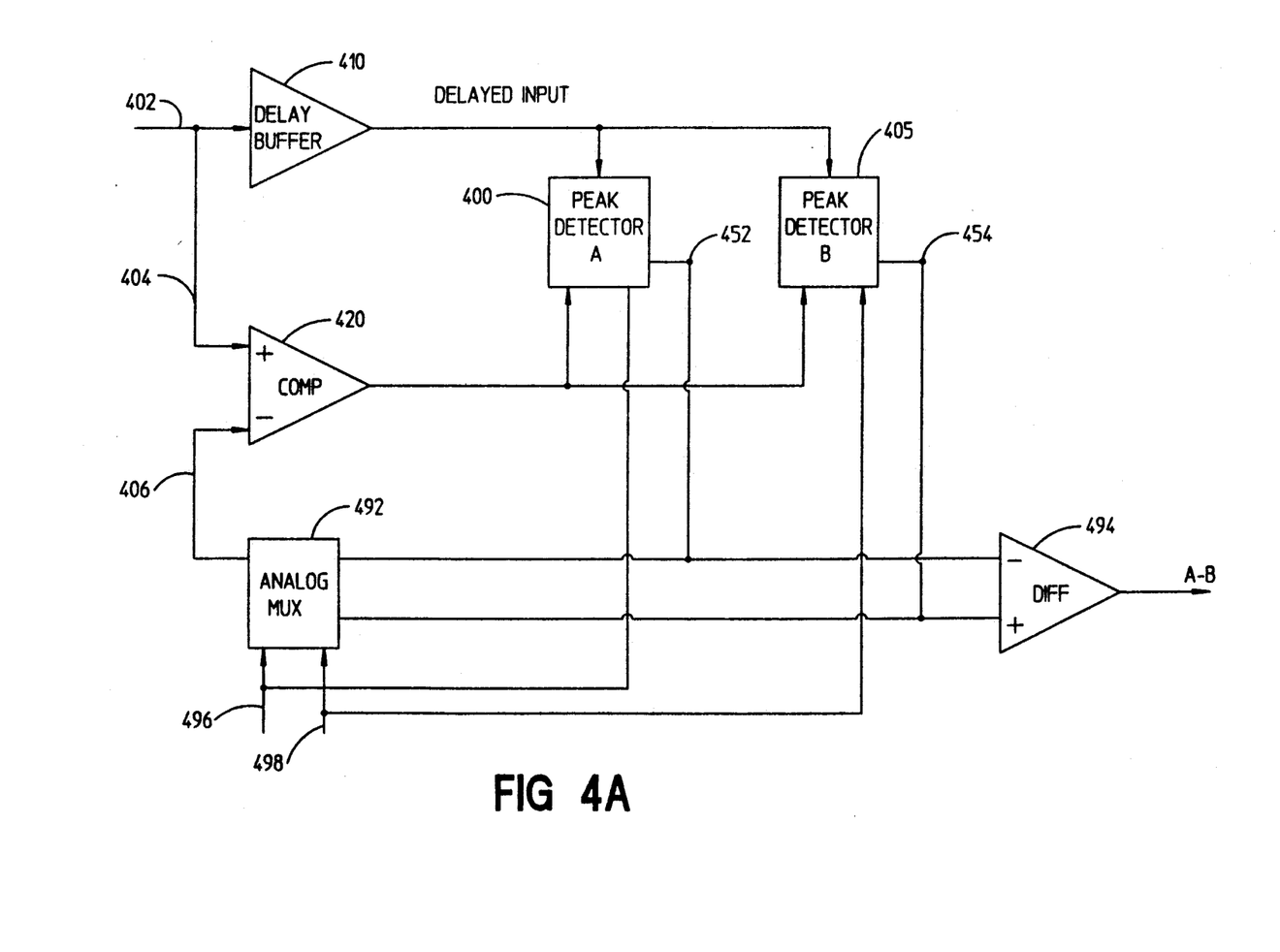
FIG. 4a shows two CMOS peak amplitude detectors using a single comparator.
Figure 4B:
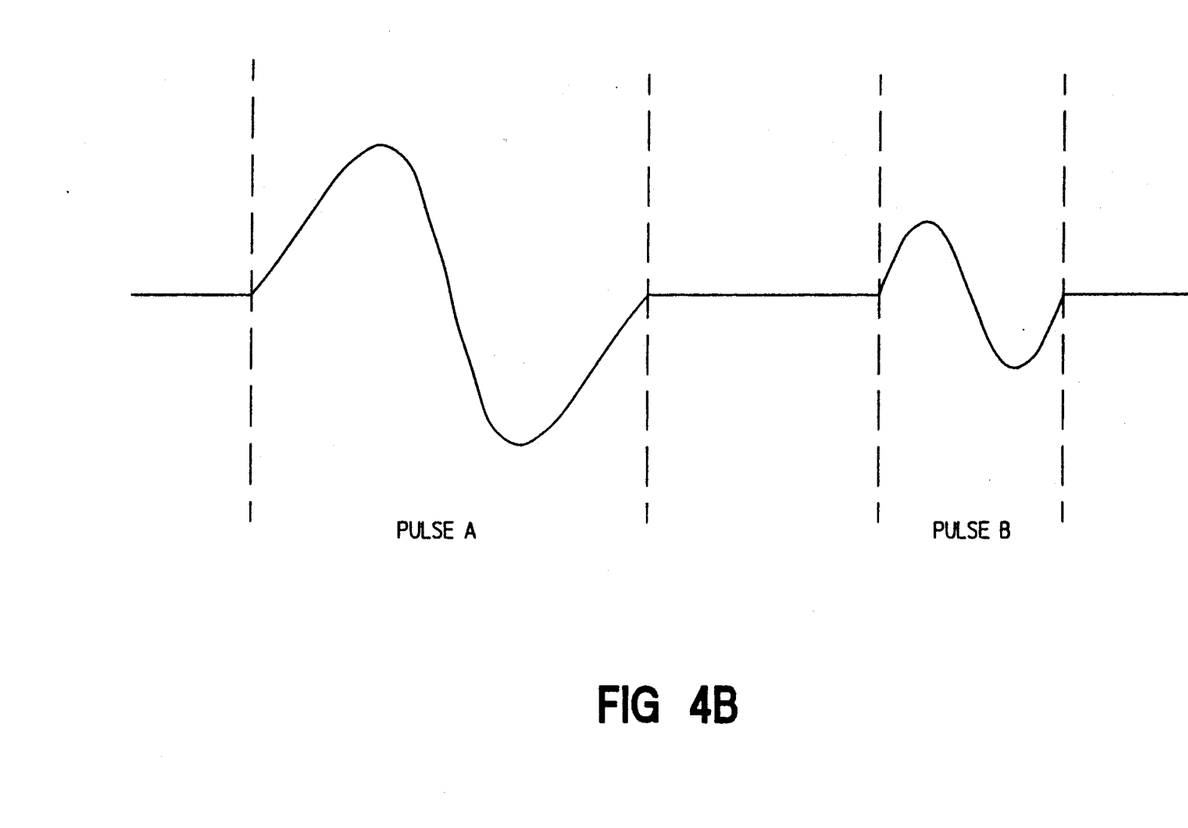

Refer now to FIG. 4a and FIG. 4b which show two peak detectors using a single comparator and a representative input signal respectively. The input signal 402, consisting of pulse A and pulse B, enters delay buffer 410 and the positive input of comparator 420. The single comparator 420 is used for both peak detectors 400, 405. This configuration eliminates at least one source of error since the single comparator has one set of comparator characteristics (e.g., voltage offset, gain and node capacitances) which generates just one comparator delay. Hence, each peak detector will acquire its respective peak with exactly the same $\Delta t$ time delay.

The peak detectors 400, 405 are constructed in a similar manner to the peak detector shown in FIG. 1. The peak amplitudes of pulse A and pulse B, which are stored on the on-chip capacitors, are outputted to nodes 452 and 454 respectively. These nodes are then tied to an analog multiplexer 492 and a differential amplifier 494. In a preferred embodiment, the peak value of pulse A plus the peak value of pulse B is a constant value. If pulse A equals pulse B, the output of the differential amplifier 494 will be zero. Otherwise, the difference will range between the constant value and its negative complement.

The analog multiplexer 492 facilitates the use of the single comparator 420 among several peak detectors. Two logical signals, GATE A 496 and GATE B 498, determine which peak detector to activate and which stored peak will be fed back through the multiplexer 492 to the comparator 420 for comparison with the incoming signal.

When pulse A is present, GATE A 496 is brought high which turns on the multiplexer 492. The multiplexer 492 then feeds the stored peak amplitude 452 from peak detector A 400 to the negative input 406 of the comparator 420. GATE A 496 also activates peak detector A 400 so that it is ready to receive the output from the comparator 420. If pulse A is larger than the stored peak, then peak detector A 400 will store pulse A as the new peak amplitude.

Likewise, when pulse B is present, GATE B 498 is brought high to activate peak detector B 405 and the multiplexer 492. The stored peak 454 from peak detector B 405 is fed through the multiplexer 492 to the comparator 420, the new input signal (i.e., pulse B) is compared with the stored peak, and peak detector B 405 may or may not store the new signal accordingly.

Figure 5:
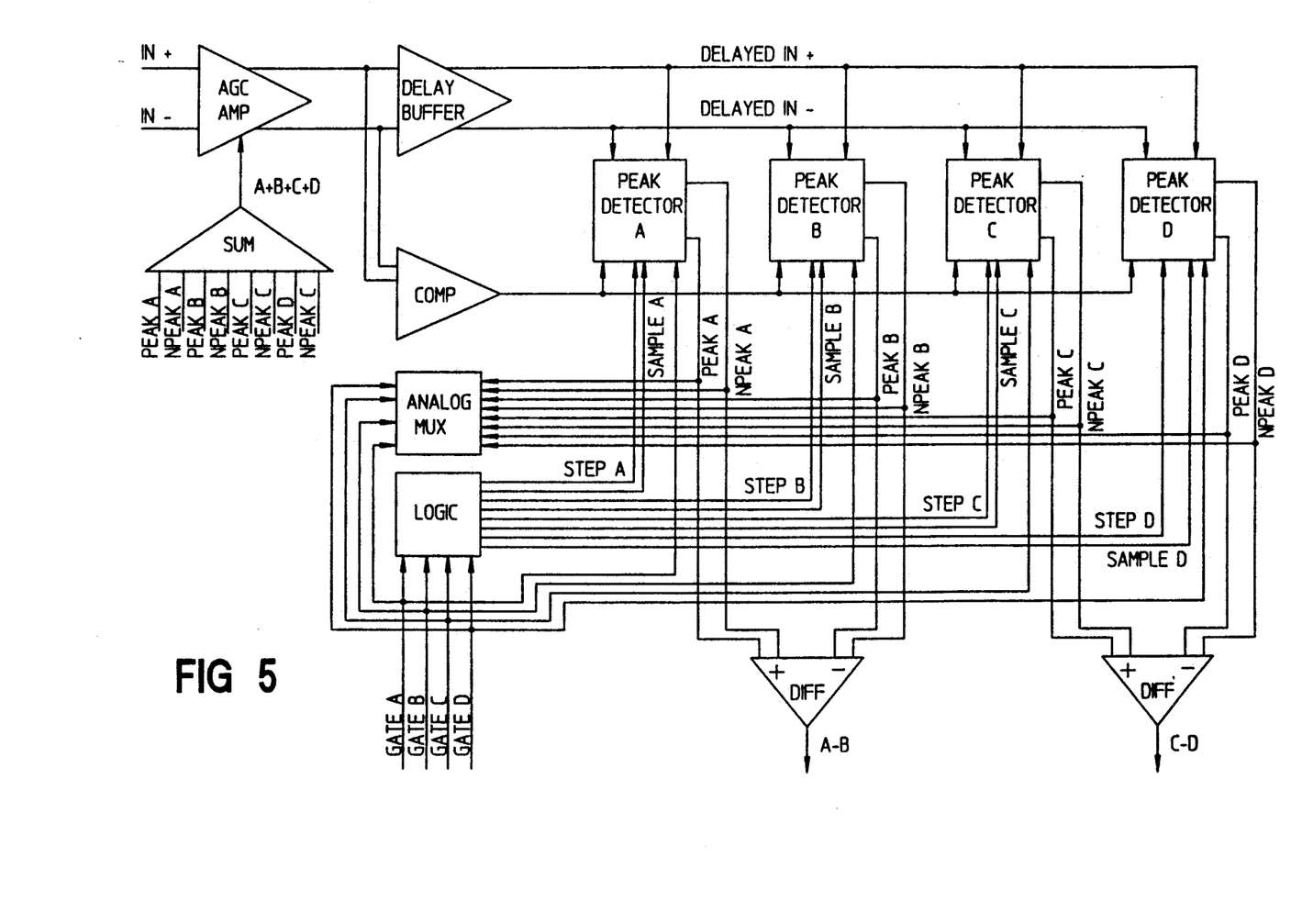
FIG. 5 shows four CMOS peak amplitude detectors using a single comparator.

FIG. 5 shows four peak detectors (peak detectors A–D) using a single comparator. The peak detector circuit is contained within an automatic gain control loop so that the sum of the peak values of the input pulses, A+B+C+D, is constant and is used to control the gain of the AGC amplifier. Peak detectors A–D, as well as the delay buffer and comparator, each consist of separate circuits for the positive side and negative side of the differential signal. Thus, the four positive peak detectors are all controlled by a single comparator multiplexed among them, while the four negative peak detectors are all controlled by another single comparator multiplexed among them.

Figure 6A:
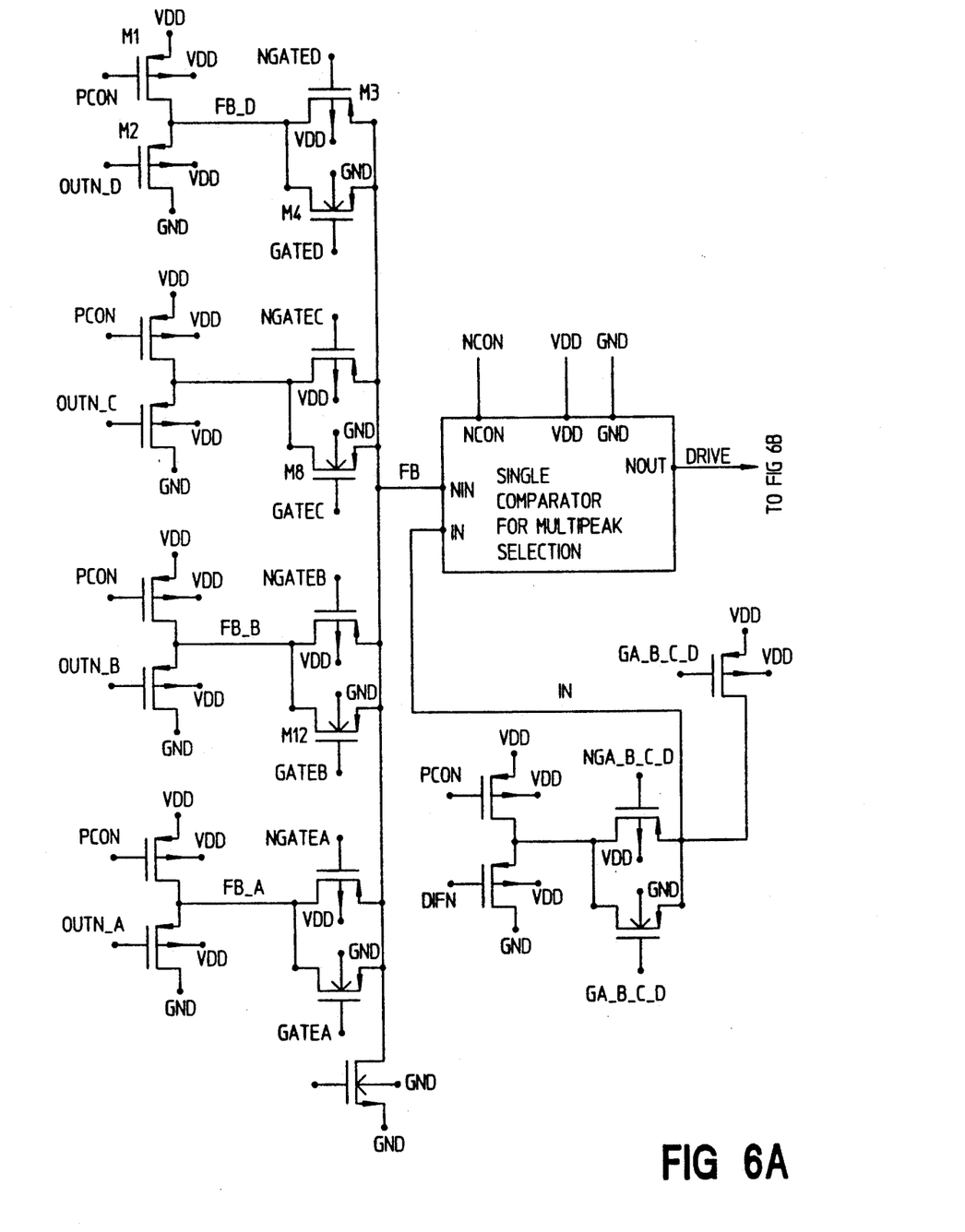
FIG. 6a shows a more detailed schematic of the present invention with a single comparator for at least four CMOS peak amplitude detectors according to the present invention.
Figure 6B:
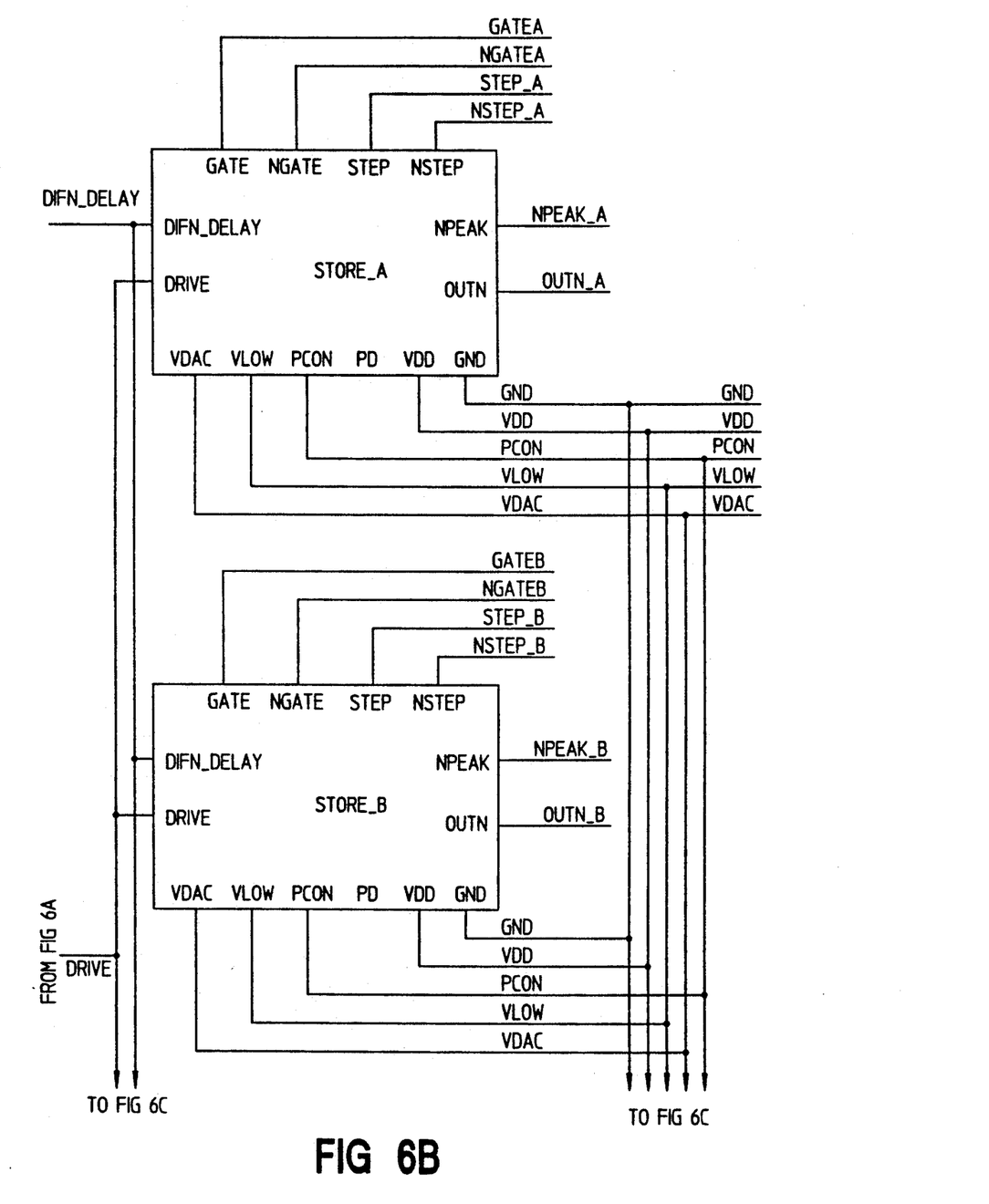
Figure 6C:
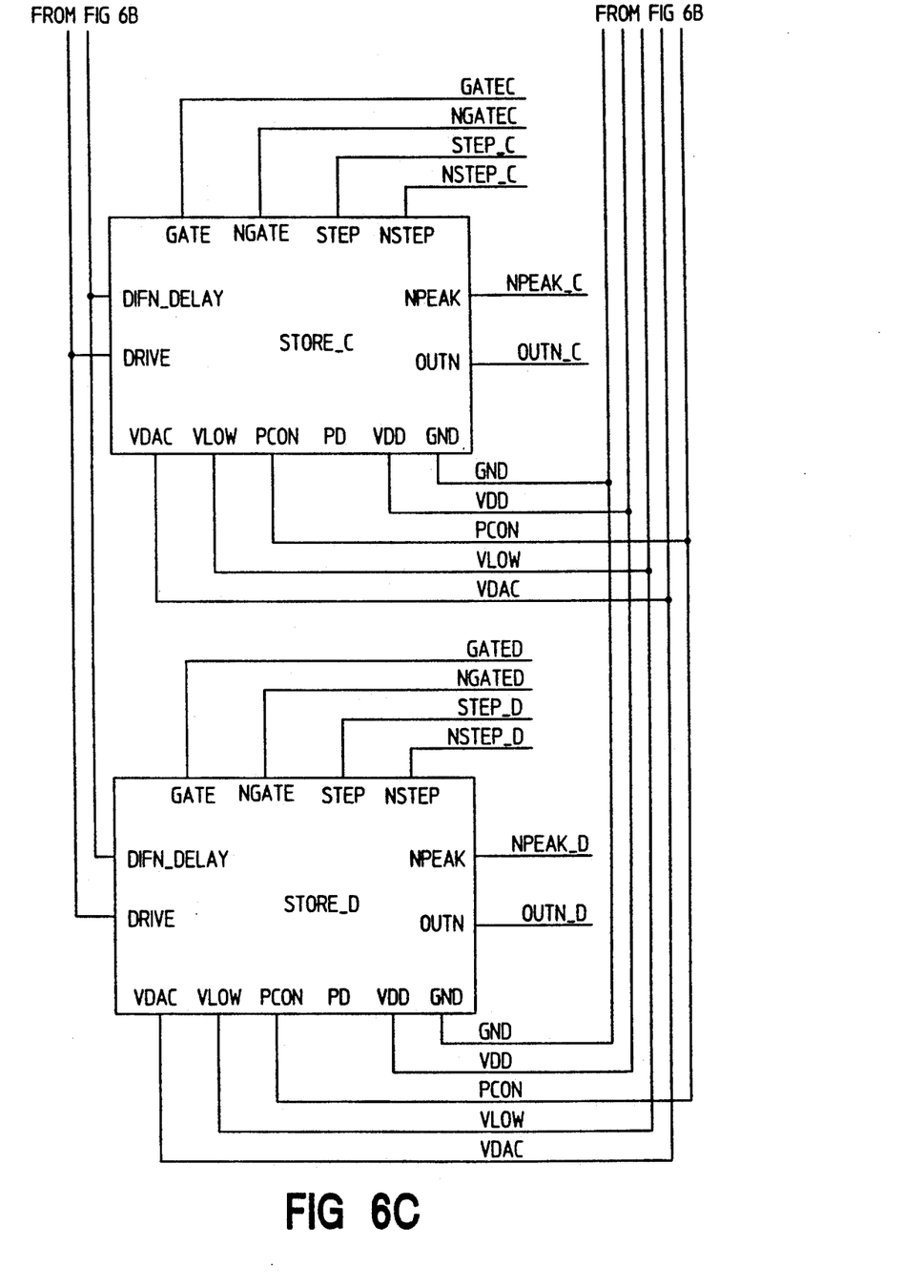
FIG. 6c is a further continuation of FIGS. 6a and 6b.

FIGS. 6a, 6b and 6c show a schematic of an actual 4×CMOS positive peak amplitude detector as used in the 1SP9-0003 disc drive servo chip available from Hewlett-Packard Company, a California corporation having a place of business at 3000 Hanover Street, Palo Alto, Calif. 94304. The four peak detectors all use the same single comparator.

While the present invention has been illustrated and described in connection with the preferred embodiment, it is not to be limited to the particular structures shown. It should be understood by those skilled in the art that various changes and modifications may be made within the purview of the appended claims without departing from the true scope and spirit of the invention in its broader aspects.

We claim:

1. An integrated CMOS peak amplitude detector comprising:
    a delay buffer generating a delayed signal, the delay buffer having an input that receives an input signal and an output that produces the delayed signal;
    a comparator having a positive undelayed input, a negative delayed input and an output, the positive input connected to the input signal;
    a transfer gate having a first input connected to the delayed signal, a second input connected to the output of the comparator, and an output; and
    a storage capacitor connected to the output of the transfer gate and the negative delayed input of the comparator, the storage capacitor being fully integrated with the delay buffer, the comparator and the transfer gate on a single chip.

2. The integrated CMOS peak amplitude detector as recited in claim 1, wherein the delay buffer is a unity-gain active filter.

3. The integrated CMOS peak amplitude detector as recited in claim 2, wherein the delay buffer delays the input signal for substantially the same time as the comparator delays the input signal.

4. The integrated CMOS peak amplitude detector as recited in claim 1, wherein the transfer gate comprises an n-channel transistor and a p-channel transistor connected in parallel, the p-channel transistor being connected to an output of an inverter, an input of the inverter being connected to the output of the comparator.

5. A discharge controller for a CMOS peak amplitude detector, the CMOS peak amplitude detector having an on-chip storage capacitor for storing a voltage, the discharge controller comprising:
    a switched capacitor circuit connected to the on-chip storage capacitor, the switched capacitor circuit being controlled by a step control signal, a charge control signal, a first voltage source ($V_1$) and a second voltage source ($V_2$);
    a unity-gain buffer having an input connected to the on-chip storage capacitor, and an output for outputting a stored voltage and being connected to the switched capacitor circuit; and
    circuitry for receiving the stored voltage, the circuitry connected to the output of the buffer.

6. The discharge controller as recited in claim 5, wherein the switched capacitor circuit comprises:
    a step capacitor having first and second electrodes;
    a first transistor having a first gate terminal, a first source terminal and a first drain terminal, the first gate terminal being connected to the step control signal, the first source terminal being connected to $V_1$, the first drain terminal being connected to the first electrode of the step capacitor;
    a second transistor having a second gate terminal, a second source terminal, and a second drain terminal, the second gate terminal being connected to the charge control signal, the second source terminal being connected $V_2$, the second drain terminal being connected to the first drain terminal and the first electrode of the step capacitor;
    a third transistor having a third gate terminal, a third source terminal, and a third drain terminal, the third gate terminal being connected to the first gate terminal and the step control signal, the third source terminal being connected to the second electrode of the step capacitor, the third drain terminal being connected to the storage capacitor; and
    a fourth transistor having a fourth gate terminal, a fourth source terminal, and a fourth drain terminal, the fourth gate terminal being connected to the second gate terminal and the charge control signal, the fourth source terminal being connected to the third source terminal and the second electrode of the step capacitor, the fourth drain terminal being connected to the output of the buffer.

7. The discharge controller as recited in claim 6, wherein the switched capacitor circuit and the storage capacitor are connected in series when the step control signal is brought high.

8. The discharge controller as recited in claim 7, wherein the switched capacitor circuit and the storage capacitor act as a capacitive voltage divider, whereby the stored voltage is stepped down some predetermined amount.

9. The discharge controller as recited in claim 8, wherein a difference between $V_2$ and $V_1$ is greater than an offset of the unity-gain buffer.

10. The discharge controller as recited in claim 9, wherein the predetermined amount is equal to a quotient formed by the capacitance of the step capacitor being divided by the sum of the capacitance of the step capacitor plus the capacitance of the storage capacitor, the quotient being multiplied by the difference between $V_2$ and $V_1$.

11. A CMOS peak amplitude circuit for reading or storing multiple peak amplitudes comprising:
    one delay buffer for generating a delayed signal, the delay buffer having an input for receiving an input signal and an output for outputting the delayed signal, the input signal having a plurality of pulses, the delayed signal having a plurality of delayed pulses;
    one comparator having a positive input, a negative input and an output, the positive input for receiving the input signal and being connected to the input of the delay buffer;
    a plurality of CMOS peak detectors for storing peak amplitudes of the plurality of pulses, the plurality of CMOS peak detectors each having an output and each being connected to the delayed signal and the comparator output; and
    a multiplexer for controlling the plurality of CMOS peak detectors, the multiplexer having a plurality inputs connected to the outputs of the plurality of CMOS peak detectors, at least first and second control inputs for receiving first and second control signals, and an output connected to the negative input of the comparator.

12. The CMOS peak amplitude circuit for reading or storing multiple peak amplitudes as recited in claim 11, wherein the plurality of CMOS peak detectors comprises:

a first CMOS peak amplitude detector for storing a first peak amplitude using an on-chip storage capacitor, the first CMOS peak amplitude detector having an output for outputting a stored peak amplitude, a first input for receiving a first delayed pulse, a second input connected to the output of the comparator, and a third input for receiving the first control signal; and a second CMOS peak amplitude detector for storing a second peak amplitude using an on-chip storage capacitor, the second CMOS peak amplitude detector having an output for outputting a stored peak amplitude, a first input for receiving a second delayed pulse, a second input connected to the output of the comparator, and a third input for receiving the second control signal.

13. The CMOS peak amplitude circuit for reading or storing multiple peak amplitudes as recited in claim 12, further comprising a differential amplifier for outputting the difference between the stored peak amplitude of the first peak detector and the stored peak amplitude of the second peak amplitude, the differential amplifier being connected to the outputs of the first and second peak detectors.

14. The CMOS peak amplitude circuit for reading or storing multiple amplitude peaks as recited in claim 13, wherein the first control signal is brought high the first pulse is present at the delay buffer and the second control signal is brought high when the second pulse is present at the delay buffer.

15. The CMOS peak amplitude circuit for reading or storing multiple peak amplitudes as recited in claim 14, wherein the delay buffer is a unity-gain active filter.

16. The CMOS peak amplitude circuit for reading or storing multiple peak amplitudes as recited in claim 15, wherein the delay buffer delays the input signal for substantially the same time as the comparator delay the input signal.

17. An integrated CMOS peak amplitude detector comprising:

a delay buffer generating a delayed signal, the delay buffer having an input that receives an input signal and an output that produces the delayed signal;

a comparator having a positive undelayed input, a negative delayed input and an output, the positive input connected to the input signal;

a transfer gate having a first input connected to the delayed signal, a second input connected to the output of the comparator, and an output; and a storage capacitor connected to the output of the transfer gate and the negative delayed input of the comparator, the storage capacitor being fully integrated with the delay buffer, the comparator and the transfer gate on a single chip; and a discharge controller comprising:
(i) a switched capacitor circuit connected to the storage capacitor, the switched capacitor circuit being controlled by a step control signal, a charge control signal, a first voltage source and a second voltage source; and
(ii) a unity-gain buffer having an input connected to the storage capacitor, and an output for outputting a stored voltage and being connected to the switched capacitor circuit.

* * * * *